United States Patent
Bertin et al.

(10) Patent No.: US 7,782,652 B2
(45) Date of Patent: Aug. 24, 2010

(54) VOLATILE NANOTUBE-BASED SWITCHING ELEMENTS WITH MULTIPLE CONTROLS

(75) Inventors: Claude L. Bertin, Burlington, VT (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 66 days.

(21) Appl. No.: 12/246,009

(22) Filed: Oct. 6, 2008

(65) Prior Publication Data

US 2009/0091352 A1    Apr. 9, 2009

Related U.S. Application Data

(60) Division of application No. 11/971,476, filed on Jan. 9, 2008, now Pat. No. 7,542,334, which is a continuation of application No. 11/197,196, filed on Aug. 4, 2005, now Pat. No. 7,339,401, which is a continuation of application No. 10/918,085, filed on Aug. 13, 2004, now Pat. No. 6,990,009.

(60) Provisional application No. 60/494,889, filed on Aug. 13, 2003, provisional application No. 60/561,330, filed on Apr. 12, 2004.

(51) Int. Cl.
*G11C 11/00* (2006.01)
(52) U.S. Cl. ........................ 365/151; 365/198; 365/191; 977/943
(58) Field of Classification Search ................. 365/154, 365/151, 189.05, 198, 191; 977/940, 943
See application file for complete search history.

(56) References Cited

U.S. PATENT DOCUMENTS 4,044,343 A    8/1977    Uchida
(Continued)

FOREIGN PATENT DOCUMENTS

GB            2364933           2/2002
(Continued)

OTHER PUBLICATIONS

Avouris, P., "Carbon nanotube electronics," Chemical Physics 2002, vol. 281, pp. 429-445.
(Continued)

*Primary Examiner*—Andrew Q Tran
(74) *Attorney, Agent, or Firm*—Wilmer Cutler Pickering Hale and Dorr LLP

(57) ABSTRACT

Nanotube-based switching elements with multiple controls and circuits made from such. A switching element includes an input node, an output node, and a nanotube channel element having at least one electrically conductive nanotube. A control structure is disposed in relation to the nanotube channel element to controllably form and unform an electrically conductive channel between said input node and said output node. The output node is constructed and arranged so that channel formation is substantially unaffected by the electrical state of the output node. The control structure includes a control electrode and a release electrode, disposed on opposite sides of the nanotube channel element. The control and release may be used to form a differential input, or if the device is constructed appropriately to operate the circuit in a non-volatile manner. The switching elements may be arranged into logic circuits and latches having differential inputs and/or non-volatile behavior.

18 Claims, 9 Drawing Sheets

U.S. PATENT DOCUMENTS

| | | | |
|---|---|---|---|
| 4,128,773 A * | 12/1978 | Troutman et al. ...... | 365/185.07 |
| 4,460,978 A * | 7/1984 | Jiang et al. ............. | 365/185.07 |
| 4,979,149 A | 12/1990 | Popovic et al. | |
| 5,414,654 A | 5/1995 | Kubota et al. | |
| 5,578,976 A | 11/1996 | Yao | |
| 5,677,823 A | 10/1997 | Smith et al. | |
| 5,682,345 A | 10/1997 | Roohparvar et al. | |
| 5,818,748 A | 10/1998 | Bertin et al. | |
| 6,097,241 A | 8/2000 | Bertin et al. | |
| 6,097,243 A | 8/2000 | Bertin et al. | |
| 6,122,191 A * | 9/2000 | Hirose et al. ........... | 365/185.01 |
| 6,128,214 A | 10/2000 | Kuekes et al. | |
| 6,136,160 A | 10/2000 | Hrkut et al. | |
| 6,159,620 A | 12/2000 | Heath et al. | |
| 6,160,230 A | 12/2000 | McMillan et al. | |
| 6,183,714 B1 | 2/2001 | Smalley et al. | |
| 6,198,655 B1 | 3/2001 | Heath et al. | |
| 6,221,330 B1 | 4/2001 | Moy et al. | |
| 6,232,706 B1 | 5/2001 | Dai et al. | |
| 6,250,984 B1 | 6/2001 | Jin et al. | |
| 6,256,767 B1 | 7/2001 | Kuekes et al. | |
| 6,314,019 B1 | 11/2001 | Kuekes et al. | |
| 6,345,362 B1 | 2/2002 | Bertin et al. | |
| 6,346,846 B1 | 2/2002 | Bertin et al. | |
| 6,353,552 B2 | 3/2002 | Sample et al. | |
| 6,373,771 B1 | 4/2002 | Fifield et al. | |
| 6,376,787 B1 | 4/2002 | Martin et al. | |
| 6,423,583 B1 | 7/2002 | Avouris et al. | |
| 6,426,687 B1 | 7/2002 | Osborn | |
| 6,445,006 B1 | 9/2002 | Brandes et al. | |
| 6,515,339 B2 | 2/2003 | Shin et al. | |
| 6,518,156 B1 | 2/2003 | Chen et al. | |
| 6,528,020 B1 | 3/2003 | Dai et al. | |
| 6,548,841 B2 | 4/2003 | Frazier et al. | |
| 6,559,468 B1 | 5/2003 | Kuekes et al. | |
| 6,574,130 B2 | 6/2003 | Segal et al. | |
| 6,597,048 B1 | 7/2003 | Kan | |
| 6,625,047 B2 | 9/2003 | Coleman, Jr. | |
| 6,625,740 B1 | 9/2003 | Datar et al. | |
| 6,643,165 B2 | 11/2003 | Segal et al. | |
| 6,661,270 B2 | 12/2003 | Nagata et al. | |
| 6,673,424 B1 | 1/2004 | Lindsay et al. | |
| 6,706,402 B2 | 3/2004 | Rueckes et al. | |
| 6,706,566 B2 | 3/2004 | Avouris et al. | |
| 6,707,098 B2 | 3/2004 | Hofmann et al. | |
| 6,741,334 B2 | 5/2004 | Asano et al. | |
| 6,750,471 B2 | 6/2004 | Bethune et al. | |
| 6,759,693 B2 | 7/2004 | Vogeli et al. | |
| 6,774,052 B2 | 8/2004 | Vogeli et al. | |
| 6,781,166 B2 | 8/2004 | Lieber et al. | |
| 6,784,028 B2 | 8/2004 | Rueckes et al. | |
| 6,794,914 B2 | 9/2004 | Sani et al. | |
| 6,803,840 B2 | 10/2004 | Hunt et al. | |
| 6,809,462 B2 | 10/2004 | Pelrine et al. | |
| 6,809,465 B2 | 10/2004 | Jin | |
| 6,835,591 B2 | 12/2004 | Rueckes et al. | |
| 6,835,613 B2 | 12/2004 | Schlaf | |
| 6,884,734 B2 | 4/2005 | Buehrer et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,946,410 B2 | 9/2005 | French et al. | |
| 6,955,937 B1 | 10/2005 | Burke et al. | |
| 6,968,486 B2 | 11/2005 | Matsushima et al. | |
| 6,969,651 B1 | 11/2005 | Lu et al. | |
| 6,986,962 B2 | 1/2006 | Oyanagi et al. | |
| 6,990,009 B2 | 1/2006 | Bertin et al. | |
| 7,015,500 B2 | 3/2006 | Choi et al. | |
| 7,054,194 B2 | 5/2006 | Liaw et al. | |
| 7,115,901 B2 | 10/2006 | Bertin et al. | |
| 7,115,960 B2 | 10/2006 | Bertin et al. | |
| 7,161,403 B2 | 1/2007 | Bertin | |
| 7,245,520 B2 | 7/2007 | Bertin et al. | |
| 7,256,063 B2 | 8/2007 | Pinkerton et al. | |
| 7,339,401 B2 | 3/2008 | Bertin et al. | |
| 7,541,842 B2 | 6/2009 | Bertin et al. | |
| 7,542,334 B2 | 6/2009 | Bertin et al. | |
| 2001/0023986 A1 | 9/2001 | Mancevski | |
| 2002/0130311 A1 | 9/2002 | Lieber et al. | |
| 2002/0130353 A1 | 9/2002 | Lieber et al. | |
| 2002/0172963 A1 | 11/2002 | Kelley et al. | |
| 2002/0173083 A1 | 11/2002 | Avouris et al. | |
| 2002/0175390 A1 | 11/2002 | Goldstein et al. | |
| 2002/0179434 A1 | 12/2002 | Dai et al. | |
| 2003/0018630 A1 | 1/2003 | Indeck et al. | |
| 2003/0021141 A1 | 1/2003 | Segal et al. | |
| 2003/0021966 A1 | 1/2003 | Segal et al. | |
| 2003/0022428 A1 | 1/2003 | Segal et al. | |
| 2003/0124325 A1 | 7/2003 | Rueckes et al. | |
| 2003/0124837 A1 | 7/2003 | Rueckes et al. | |
| 2003/0132823 A1 | 7/2003 | Hyman et al. | |
| 2003/0165074 A1 | 9/2003 | Segal et al. | |
| 2003/0177450 A1 | 9/2003 | Nugent | |
| 2003/0198812 A1 | 10/2003 | Rueckes et al. | |
| 2003/0199172 A1 | 10/2003 | Rueckes et al. | |
| 2003/0200521 A1 | 10/2003 | DeHon et al. | |
| 2003/0206436 A1 | 11/2003 | Eaton et al. | |
| 2003/0234407 A1 | 12/2003 | Vogeli et al. | |
| 2003/0236000 A1 | 12/2003 | Vogeli et al. | |
| 2004/0023514 A1 | 2/2004 | Moriya et al. | |
| 2004/0031975 A1 | 2/2004 | Kern et al. | |
| 2004/0031976 A1 | 2/2004 | Uya et al. | |
| 2004/0041154 A1 | 3/2004 | Watanabe et al. | |
| 2004/0075125 A1 | 4/2004 | Asao | |
| 2004/0075159 A1 | 4/2004 | Vogeli | |
| 2004/0077107 A1 | 4/2004 | Vogeli | |
| 2004/0085805 A1 | 5/2004 | Segal et al. | |
| 2004/0087162 A1 | 5/2004 | Vogeli | |
| 2004/0099438 A1 | 5/2004 | Arthur et al. | |
| 2004/0104129 A1 | 6/2004 | Gu et al. | |
| 2004/0159833 A1 | 8/2004 | Rueckes et al. | |
| 2004/0164289 A1 | 8/2004 | Rueckes et al. | |
| 2004/0175856 A1 | 9/2004 | Jaiprakash et al. | |
| 2004/0181630 A1 | 9/2004 | Jaiprakash et al. | |
| 2004/0191978 A1 | 9/2004 | Rueckes et al. | |
| 2004/0197978 A1 | 10/2004 | Dobler et al. | |
| 2004/0198030 A1 | 10/2004 | Buehrer et al. | |
| 2004/0214366 A1 | 10/2004 | Segal et al. | |
| 2004/0214367 A1 | 10/2004 | Segal et al. | |
| 2004/0238907 A1 | 12/2004 | Pinkerton et al. | |
| 2005/0007002 A1 | 1/2005 | Golovchenko et al. | |
| 2005/0035344 A1 | 2/2005 | Bertin et al. | |
| 2005/0035367 A1 | 2/2005 | Bertin et al. | |
| 2005/0035369 A1 | 2/2005 | Lin et al. | |
| 2005/0035786 A1 | 2/2005 | Bertin et al. | |
| 2005/0035787 A1 | 2/2005 | Bertin et al. | |
| 2005/0036365 A1 | 2/2005 | Bertin et al. | |
| 2005/0037547 A1 | 2/2005 | Bertin et al. | |
| 2005/0040874 A1 | 2/2005 | Allison et al. | |
| 2005/0041465 A1 | 2/2005 | Rueckes et al. | |
| 2005/0041466 A1 | 2/2005 | Rueckes et al. | |
| 2005/0047244 A1 | 3/2005 | Rueckes et al. | |
| 2005/0052894 A1 | 3/2005 | Segal et al. | |
| 2005/0053525 A1 | 3/2005 | Segal et al. | |
| 2005/0056825 A1 | 3/2005 | Bertin et al. | |
| 2005/0056866 A1 | 3/2005 | Bertin et al. | |
| 2005/0056877 A1 | 3/2005 | Rueckes et al. | |
| 2005/0058590 A1 | 3/2005 | Sen et al. | |
| 2005/0058797 A1 | 3/2005 | Sen et al. | |
| 2005/0058834 A1 | 3/2005 | Rueckes et al. | |
| 2005/0059176 A1 | 3/2005 | Rueckes et al. | |
| 2005/0059210 A1 | 3/2005 | Rueckes et al. | |
| 2005/0062035 A1 | 3/2005 | Bertin et al. | |
| 2005/0062062 A1 | 3/2005 | Bertin et al. | |

| | | | |
|---|---|---|---|
| 2005/0062070 A1 | 3/2005 | Bertin et al. | |
| 2005/0063210 A1 | 3/2005 | Segal et al. | |
| 2005/0063244 A1 | 3/2005 | Bertin et al. | |
| 2005/0269554 A1 | 12/2005 | Sen et al. | |
| 2005/0270824 A1 | 12/2005 | Bertin et al. | |
| 2005/0279988 A1 | 12/2005 | Bertin | |
| 2005/0280436 A1 | 12/2005 | Bertin | |
| 2005/0281084 A1 | 12/2005 | Rueckes et al. | |
| 2005/0282515 A1 | 12/2005 | Bertin | |
| 2005/0282516 A1 | 12/2005 | Bertin | |
| 2006/0044035 A1 | 3/2006 | Bertin | |
| 2006/0061389 A1 | 3/2006 | Bertin | |
| 2006/0125033 A1 | 6/2006 | Segal et al. | |
| 2006/0128049 A1 | 6/2006 | Jaiprakash et al. | |
| 2006/0183278 A1 | 8/2006 | Bertin et al. | |
| 2006/0193093 A1 | 8/2006 | Bertin et al. | |
| 2006/0204427 A1 | 9/2006 | Ghenciu et al. | |
| 2006/0231865 A1 | 10/2006 | Bertin et al. | |
| 2006/0237537 A1 | 10/2006 | Empedocles | |
| 2006/0237805 A1 | 10/2006 | Bertin et al. | |
| 2006/0237857 A1 | 10/2006 | Bertin et al. | |
| 2006/0250843 A1 | 11/2006 | Bertin et al. | |
| 2006/0250856 A1 | 11/2006 | Bertin et al. | |
| 2006/0255834 A1 | 11/2006 | Ward et al. | |
| 2006/0276056 A1 | 12/2006 | Ward et al. | |
| 2007/0015303 A1 | 1/2007 | Bertin et al. | |
| 2008/0186756 A1 | 8/2008 | Bertin et al. | |

FOREIGN PATENT DOCUMENTS

| | | | |
|---|---|---|---|
| JP | 2004090208 A | | 3/2004 |
| WO | WO-00/48195 | | 8/2000 |
| WO | WO-01/03208 | A1 | 1/2001 |
| WO | WO-144796 | A1 | 6/2001 |
| WO | WO-3091486 | A1 | 11/2003 |
| WO | WO-2004065655 | A1 | 8/2004 |
| WO | WO-2004065657 | A1 | 8/2004 |
| WO | WO-2004065671 | A1 | 8/2004 |

OTHER PUBLICATIONS

Kinaret, J. M. et al "A Carbon-nanotube-based nanorelay," *Applied Physics Letters*, Feb. 24, 2003, vol. 82, No. 8, pp. 1287-1289.
Martel, R., et al, "Carbon Nanotube Field-Effect Transistors and Logic Circuits," *DAC 2002*, Jun. 10-12, 2002, vol. 7.4, pp. 94-98.
Radosavljevic, M. et al., "Nonvolatile molecular memory elements based on ambipolar nanotube field effect transistors," Nano Letters, 2002, vol. 2(7), pp. 761-764.
Rueckes, T., et al., "Carbon Nanotube-Based Nonvolatile Random Access Memory for Molecular Computing", Science, vol. 289, Issue 5476, Jul. 7, 2000, pp. 94-97.
Bachtold, A. et al., "Logic Circuits Based on Carbon Nanotubes," Physica E 16 (2003), pp. 42-46.
Derycke, V. et al. "Carbon Nanotube Inter-and Intramolecular Logic Gates." Nano Letters, Vol. 1, pp. 453-456, Sep. 2001.
Derycke, V., "Controlling Doping and Carrier Injection in Carbon NanotubeTransistors", Applied Physics Letters, 2002. 80 (15) 2773-2775.
Duan, Xiangfeng, Nonvolatile Memory and Programmable Logic from Molecule-Gated Nanowires, Nano Letters, Mar. 2002, pp. 1-4.
Heinze, S., "Carbon Nanotubes as Schottky Barrier Transistors," Physical Review Letters, vol. 89, No. 10, pp. 106801-1-106801-4, Sep. 2, 2002.
Javey, Ali et al., "Carbon Nanotube Transistor Arrays for Multistage Complementary Logic and Ring Oscillators", Nano Letters, 2002. 2 (9) 929-932.
Luyken, R.J. et al., "Concepts for hybrid CMOS-molecular non-volatile memories", Nanotechnology, 2003. 14, 273-276.
Wind, S. J., "Fabrication and Electrical Characterization of Top Gate Single-Wall Carbon Nanotube Field-Effect Transistors," IBM T. J. Watson Research Center, 14 pgs., 2002.
Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.
Huang, Y., et al "Logic Gates and Computation from Assembled Nanowire Building Blocks," *Science*, Nov. 9, 2001, vol. 294, pp. 1313-1316.
Javey, A. et al., "Carbon Nanotube Field-Effect Transistors with Integrated Ohmic Contacts and High-k Gate Dielectrics", *Nano Letters*, vol. 4, No. 3, pp. 447-450, 2004.
Javey, A. et al., "High-k dielectrics for advanced carbon-nanotube transistors and logic gates", *Nature Materials*, vol. 1, pp. 241-246, Dec. 2002.
Lin, Y.M. et al., "Novel Carbon Nanotube FET Design with Tunable Polarity", *IEDM*, pp. 29.2.1-29.2.4, 2004.
Wind, S. J. et al., "Vertical Scaling of carbon nanotube field-effect transistors using top gate electrodes", *Applied Physics Letters*, vol. 80, No. 20, pp. 3817-3819, May 20, 2002.
Ajayan, P.M. et al., "Nanometre-size tubes of carbon," Rep. Prog. Phys., 1997, vol. 60, pp. 1025-1062.
Ami, S. et al., "Logic gates and memory cells based on single C.sub. 60electromechanical transistors," Nanotechnology, 2001, vol. 12, pp. 44-52.
Bachtold, A. et al., "Logic Circuits Based on Carbon Nanotubes," Physica E 16 (2003, pp. 42- 46.
Bernholc et al., "Mechanical and electrical properties of nanotubes", Ann. Rev. Mater. Res., vol. 32, p. 347, 2002.
Bradley, K. et al., "Flexible Nanotube Electronics", Nano Letters, vol. 3, No. 10, pp. 1353-1355, Aug. 14, 2003.
Casavant, M.J. et al., "Neat macroscopic membranes of aligned carbon nanotubes," Journal of Appl. Phys., 2003, vol. 93(4), pp. 2153-2156, Feb. 15, 2003.
Choi, W.-B. et al., "Carbon-nanotube-based nonvolatile memory with oxide-nitride-film and nanoscale channel," Appl. Phys. Lett., 2003, vol. 82(2), pp. 275-277, Jan. 13, 2003.
Collins, et al., Engineering Carbon Nanotubes and Nanotube Circuits Using Electrical Breakdown, Science, vol. 292, pp. 706-709, Apr. 2001.
Cui, J.B. et al., "Carbon Nanotube Memory Devices of High Charge Storage Stability," Appl. Phys. Lett., 2002, vol. 81(17), pp. 3260-3262, Oct. 21, 2002.
Dai, H. et al., "Controlled Chemical Routes to nanotube Architectures, Physics, and Devices," J. Phys. Chem. B, 1999, vol. 103, pp. 11246-11255.
Dehon, A., "Array-Based Architecture for FET-Based, Nanoscale Electronics," IEEE Transactions on Nanotechnology, 2003, vol. 2(1), pp. 23-32.
Dequesnes, M. et al., "Calculation of pull-in voltages for carbon-nanotube-based nanoelectromechanical switches," Nanotechnology, 2002, vol. 13, pp. 120-131, Jan. 22, 2002.
Dequesnes, M. et al., "Simulation of carbon nanotube-based nanoelectromechanical switches," Computational Nanoscience and Nanotechnology, 2002, pp. 383-386.
Fan, S. et al., "Carbon nanotube arrays on silicon substrates and their possible application," Physica E, 2000, vol. 8, pp. 179-183.
Farajian, A. A. et al., "Electronic transport through bent carbon nanotubes: Nanoelectromechanical sensors and switches," Phys. Rev. B, 2003, vol. 67, pp. 205423-1-205423-6, May 30, 2003.
Fischer, J.E. et al., "Magnetically aligned single wall carbon nanotube films: Preferred orientation and anisotropic transport properties," Journal of Appl. Phys., 2003, vol. 93(4), pp. 2157-2163.
Franklin, N. R. et al., "Integration of suspended carbon nanotube arrays into electronic devices and electromechanical systems," Appl. Phys. Lett., 2002, vol. 81(5), pp. 913-915.
Fuhrer, M.S. et al., "High-Mobility Nanotube Transistor Memory," Nano Letters, 2002, vol. 2(7), pp. 755-759.
Homma, Y. et al., "Growth of Suspended Carbon Nanotubes Networks on 100-nm-scale Silicon Pillars," Appl. Phys. Lett., 2002, vol. 81(12), pp. 2261-2263.
Lee, K.-H. et al., "Control of growth orientation for carbon nanotubes," Appl. Phys. Lett., 2003, vol. 82(3), pp. 448-450, Jan. 20, 2003.
Lin, Yu-Ming et al., "Novel Carbon Nanotube Fet Design with Tunable Polarity," IEDM 04-687, Copyright 2004 IEEE, 4 pages.

Onoa et al., "Bulk Production of singly dispersed carbon nanotubes with prescribed lengths", Nanotechnology, vol. 16, pp. 2799-2803, 2005.

Robinson, L.A.W., "Self-Aligned Electrodes for Suspended Carbon Nanotube Structures," Microelectronic Engineering, 2003, vol. 67-68, pp. 615-622.

Soh, H. T. et al., "Integrated nanotube circuits: Controlled growth and ohmic contacting of single-walled carbon nanotubes," Appl. Phys. Lett., 1999, vol. 75(5), pp. 627-629.

Sreekumar, T.V., et al., "Single-wall Carbon Nanotube Films", Chem. Mater. 2003, vol. 15, pp. 175-178.

Stadermann, M. et al., "Nanoscale study of conduction through carbon nanotube networks", Phys. Rev. B 69, 201402(R), 2004.

T Rueckes et al., "Carbon Nanotube-Based Nonvolatile Random Access Memory for Molecular Computing", Science, vol. 289, Issue 5476, Jul. 7, 2000, pp. 94-97. cited by examiner.

Tans, S. et al., "Room-temperature based on a single carbon nanotube,"Nature, 1998, vol. 393, pp. 49-52.

Tour, J. M. et al., "NanoCell Electronic Memories," J. Am. Chem Soc., 2003, vol. 125, pp. 13279-13283, Verissimo-Alves, M. et al., "Electromechanical effects in carbon nanotubes: Ab initio and analytical tight-binding calculations," Phys. Rev. B, 2003, vol. 67, pp. 161401-1-161401-4.

Wind, S. J., "Fabrication and Electrical Characterization of Top Gate Single-Wall Carbon Nanotube Field-Effect Transistors," IBM T. J. Watson Research Center, 14 pgs., 2002.

Wolf, S., Silicon Processing for the VLSI era; vol. 2-Process Integration, Lattice Press, Sunset Beach, 1990, pp. 189-191, pp. 260-273.

Zhan, W. et al., "Microelectrochemical Logic Circuits," J. Am. Chem. Soc., 2003, vol. 125, pp. 9934-9935.

* cited by examiner

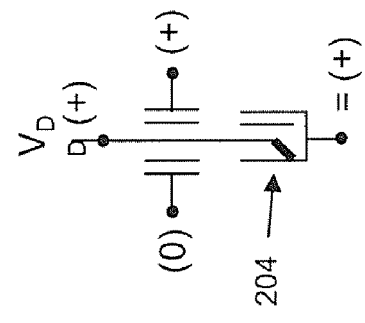
Figure 2C
Figure 3C
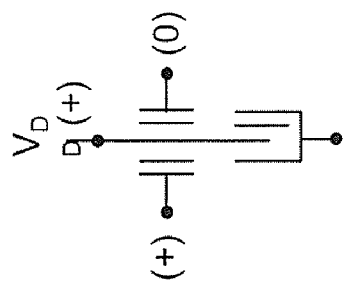
Figure 2B
Figure 3B
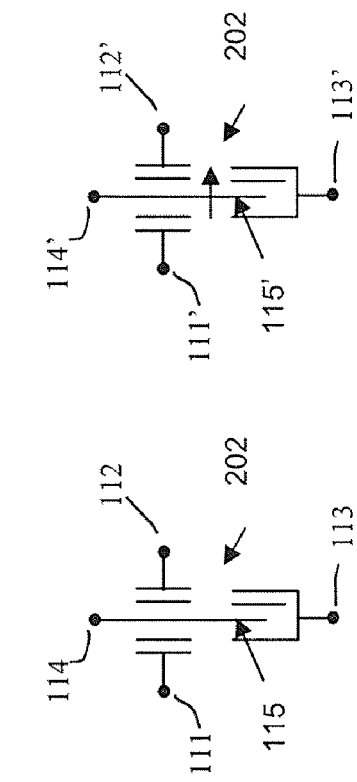
Figure 2A'
Figure 2A
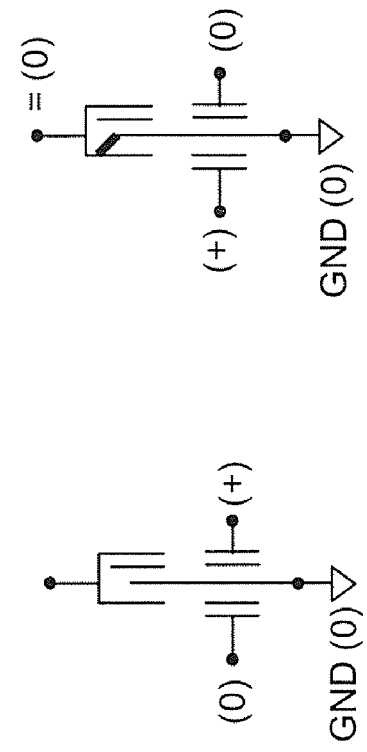
Figure 3A

VOLATILE NANOTUBE-BASED SWITCHING ELEMENTS WITH MULTIPLE CONTROLS

CROSS-REFERENCE TO RELATED APPLICATIONS

This application is a divisional of and claims priority under 35 U.S.C. §120 to U.S. patent application Ser. No. 11/971,476, filed on Jan. 9, 2008, entitled Nanotube-Based Switching Elements with Multiple Controls, which is a continuation of and claims priority under 35 U.S.C. §120 to U.S. patent application Ser. No. 11/197,196, filed on Aug. 4, 2005 now U.S. Patent Publication No. 2005/0270824, entitled Nanotube-Based Switching Elements with Multiple Controls, which is a continuation of and claims priority under 35 U.S.C. §120 to U.S. patent application Ser. No. 10/918,085, filed on Aug. 13, 2004, now U.S. Pat. No. 6,990,009, entitled Nanotube-Based Switching Elements with Multiple Controls, which claims priority under 35 U.S.C. §119(e) to U.S. Provisional Patent Application No. 60/561,330, filed on Apr. 12, 2004, entitled Non-volatile CNT Dual-Rail Differential Logic, and also claims priority under 35 U.S.C. §119(e) to U.S. Provisional Patent Application No. 60/494,889, filed on Aug. 13, 2003, entitled Nanoelectromechanical Nanotube-Based Logic, which are incorporated herein by reference in their entirety.

This application is related to the following references:

U.S. Patent Application No. TBD, filed on date even herewith, entitled Nanotube-Based Switching Elements with Multiple Controls and Logic Circuits Having Said Elements;

U.S. patent application Ser. No. 11/197,196, filed on Aug. 4, 2005, now U.S. Patent Publication No. 2005/0270824, entitled Nanotube-Based Switching Elements with Multiple Controls;

U.S. patent application Ser. No. 10/917,794, filed on Aug. 13, 2004, now U.S. Pat. No. 7,115,960, entitled Nanotube-Based Switching Elements with Multiple Controls;

U.S. patent application Ser. No. 10/917,893, filed on Aug. 13, 2004, now U.S. Pat. No. 7,138,832, entitled Nanotube-Based Switching Elements And Logic Circuits;

U.S. patent application Ser. No. 10/917,606, filed on Aug. 13, 2004, now U.S. Publication No. 2005/0035344, entitled Isolation Structure for Deflectable Nanotube Elements; and U.S. patent application Ser. No. 10/918,181, filed on Aug. 13, 2004, now U.S. Pat. No. 7,071,023, entitled Nanotube Device Structures and Methods of Fabrication.

BACKGROUND

1. Technical Field

The present application generally relates to nanotube switching circuits and in particular to nanotube switching circuits that use nanotubes to form a conductive channel of the switch and that may be interconnected into larger circuits, such as Boolean logic circuits.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environments. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to certain extreme environments because electrical currents are generated inside the semiconductor material. It is possible to manufacture integrated circuits with special devices and isolation techniques so that they remain operational when exposed to such environments, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electro-mechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402, 6,784,028, 6,835,591, 6,911,682, 6,919,592 and 6,924,538; and U.S. patent application Ser. Nos. 10/341,005, 10/341,055, 10/341, 054, 10/341,130 and 10/776,059, the contents of which are hereby incorporated by reference in their entireties).

SUMMARY

The present invention provides nanotube-based switching elements with multiple controls and circuits made from such.

Under one aspect of the invention, a switching element includes an input node, an output node, and a nanotube channel element having at least one electrically conductive nanotube. A control structure is disposed in relation to the nanotube channel element to controllably form and unform an electrically conductive channel between said input node and said output node. The output node is constructed and arranged so that channel formation is substantially unaffected by the electrical state of the output node.

Under another aspect of the invention, the control structure includes a control electrode and a release electrode, disposed on opposite sides of the nanotube channel element.

Under another aspect of the invention, channel formation is a non-volatile state.

Under another aspect of the invention, the control electrode and said release electrode are arranged in relation to the nanotube channel element to form and unform said conductive channel by causing electromechanical deflection of said nanotube channel element.

Under another aspect of the invention, the nanotube channel element includes an isolation structure having two sets of electrodes disposed on opposite sides of the control structure, each set of electrodes including electrodes disposed on opposite side of the nanotube channel element.

Under another aspect of the invention, the two sets of electrodes are symmetrically disposed in relation to control structure.

Under another aspect of the invention, the nanotube channel element is in electrical communication with the input node and is positioned in spaced and crossed relation relative to the control electrode and the release node and wherein deflection of said nanotube channel element is in response to electrostatic forces resulting from signals on the input node, the control electrode and the release node.

Under another aspect of the invention, deflection of the nanotube channel element is in response to a differential signal relationship applied to the control electrode

BRIEF DESCRIPTION OF THE DRAWINGS

In the Drawing,

FIGS. 2A-2C and 3A-3C show a schematic representation of a nanotube switching element;

DETAILED DESCRIPTION

Preferred embodiments of the invention provide switching elements in which a nanotube-based channel may be controllably formed and unformed, so that a signal may be transferred from a signal node to an output node. The switching element includes multiple control electrodes to control the formation and unformation of the channel, to provide a dual-rail capability, and to be used in novel ways. The transferred signal may be a varying signal or a reference signal, depending on the manner in which the switching element is utilized and arranged. Preferred embodiments provide an isolation structure so that such signal transfer and the switching element's operation is substantially invariant to the output state. For example, the output node may float and/or be tied to other electrical components and the circuit will operate in a predictable switch-like manner. Consequently, the switching elements may be formed into larger circuits, such as Boolean logic circuits. Under some embodiments, the switching elements are used as complimentary circuitry. Under some embodiments the switch maintains its state in the absence of power providing non-volatile logic. Under some embodiments the switching elements are used to form differential (dual-rail) logic.

Figure 1A:
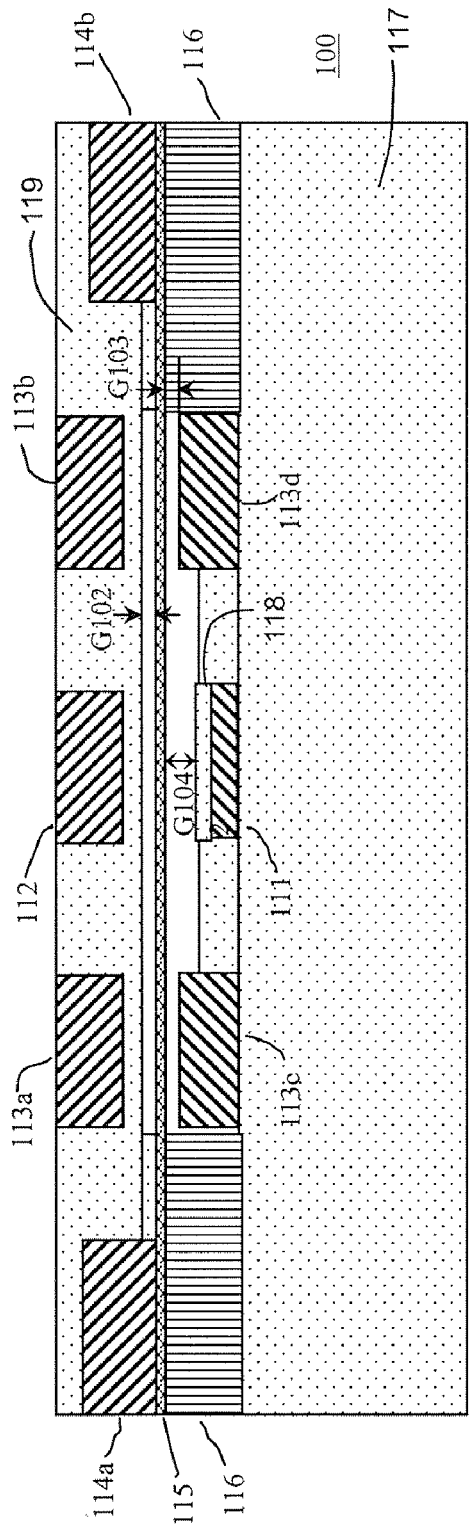
FIGS. 1A-1D illustrate cross-sectional views of a nanotube switching element of certain embodiments in two different states and include a plan view of such element.

FIG. 1A is a cross sectional view of a preferred nanotube switching element 100. Nanotube switching element includes a lower portion having an insulating layer 117, control electrode 111, output electrodes 113c,d. Nanotube switching element further includes an upper portion having release electrode 112, output electrodes 113a,b, and signal electrodes 114a,b. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113a,b are made of conductive material and are separated from nanotube channel element 115 by insulating material 119.

Output electrodes 113c,d are likewise made of conductive material and are separated from nanotube channel element 115 by a gap height G103. Notice that the output electrodes 113c,d are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114a,b each contact the nanotube channel element 115 and can therefore supply whatever signal is on the signal electrode to the channel element 115. This signal may be a fixed reference signal (e.g., Vdd or Ground) or varying (e.g., a Boolean discrete value signal that can change). Only one of the electrodes 114a,b need be connected, but both may be used to reduce effective resistance.

Nanotube channel element 115 is a lithographically-defined article made from a porous fabric of nanotubes (more below). It is electrically connected to signal electrodes 114a, b. The electrodes 114a,b and support 116 pinch or hold the channel element 115 at either end, and it is suspended in the middle in spaced relation to the output electrodes 113a-d and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-30 nm. The dielectric on terminals 112, 111, and 113a and 113b are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

Figure 1B:
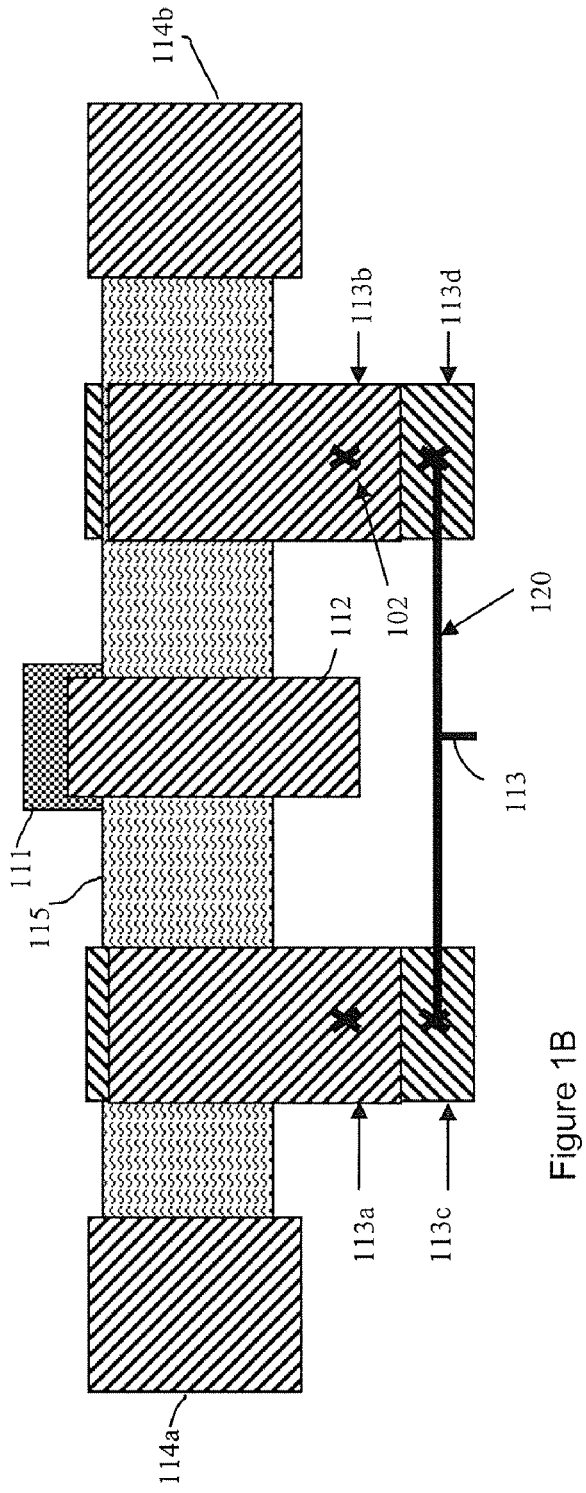

FIG. 1B is a plan view or layout of nanotube switching element 100. As shown in this figure, electrodes 113b,d are electrically connected as depicted by the notation 'X' and item 102. Likewise electrodes 113a,c are connected as depicted by the 'X'. In preferred embodiments the electrodes are further connected by connection 120. All of the output electrodes collectively form an output node 113 of the switching element 100.

Figure 1C:
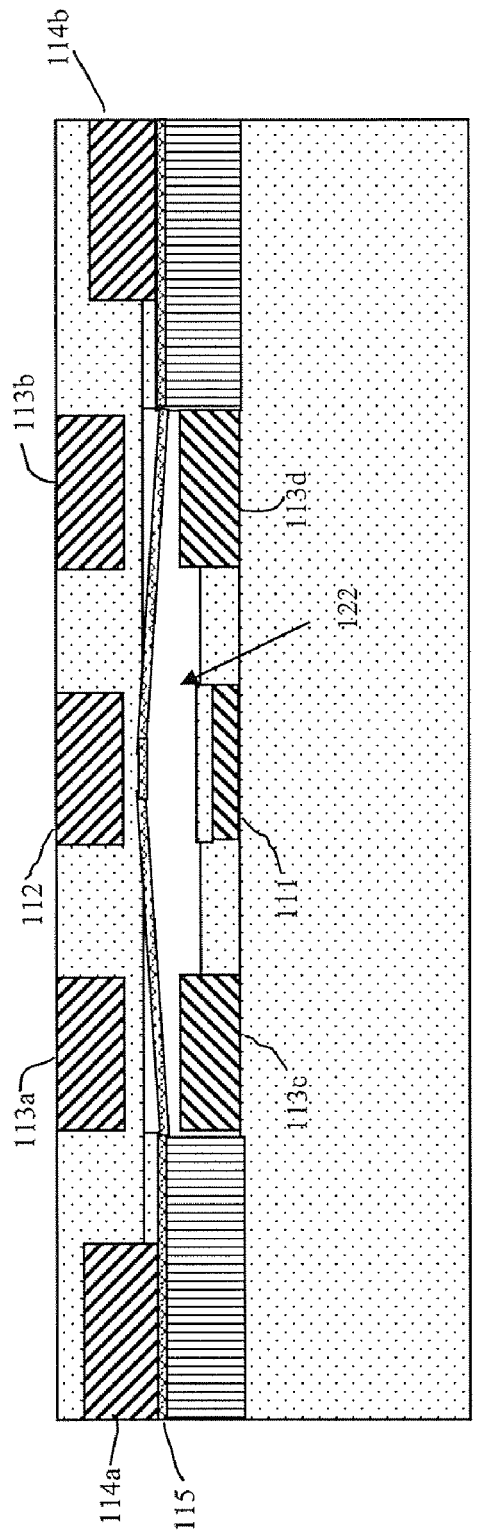
Figure 1D:
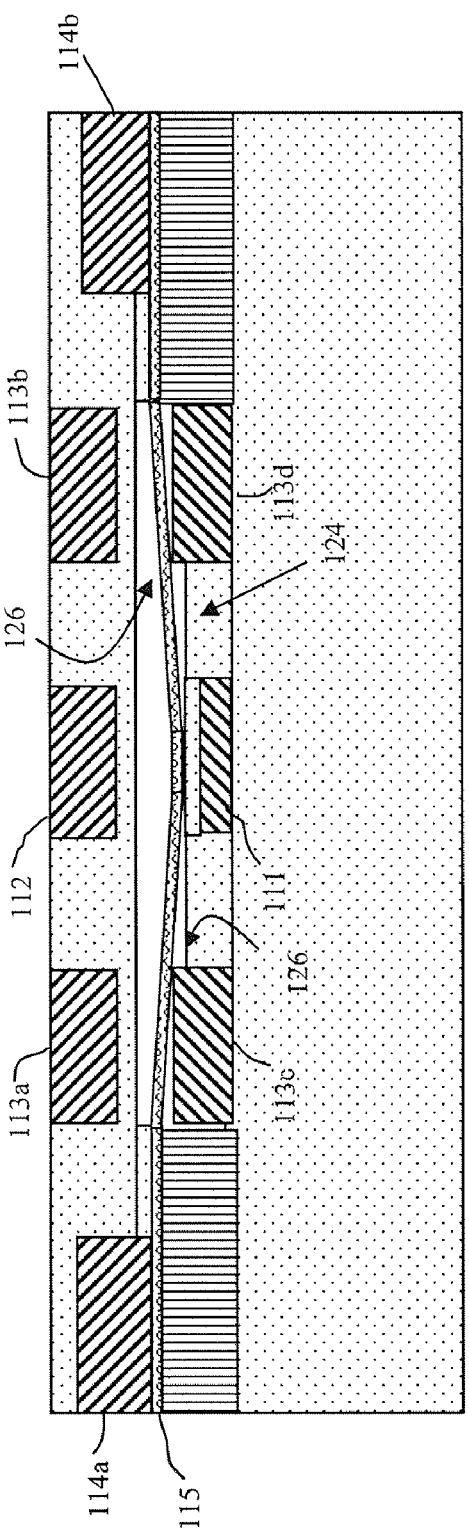

Under preferred embodiments, the nanotube switching element 100 of FIGS. 1A and 1B operates as shown in FIGS. 1C and D. Specifically, nanotube switching element 100 is in an OPEN (OFF) state when nanotube channel element is in position 122 of FIG. 1C. In such state, the channel element 115 is drawn into mechanical contact with dielectric layer 119 via electrostatic forces created by the potential difference between electrode 112 and channel element 115. Output electrodes 113a,b are in mechanical contact (but not electrical contact) with channel element 115. Nanotube switching element 100 is in a CLOSED (ON) state when channel element 115 is elongated to position 124 as illustrated in FIG. 1D. In such state, the channel element 115 is drawn into mechanical contact with dielectric layer 118 via electrostatic forces created by the potential difference between electrode 111 and channel element 115. Output electrodes 113c,d are in mechanical contact and electrical contact with channel element 115 at regions 126. Consequently, when channel element 115 is in position 124, signal electrodes 114a and 114b are electrically connected with output terminals 113c,d via channel element 115, and the signal on electrodes 114a,b may be transferred via the channel (including channel element 115) to the output electrodes 113c,d.

By properly tailoring the geometry of nanotube switching element 100, the nanotube switching element 100 may be made to behave as a non-volatile or a volatile switching element. By way of example, the device state of FIG. 1D may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 101 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described in the incorporated patent references.) This deflection is depicted in FIG. 1D (and 1C). The attractive force streches and deflects the nanotube fabric of channel element 115 until it contacts the insulated region 118 of the electrode 111. The nanotube channel element is thereby strained, and there is a restoring tensil force, dependent on the geometrical relationship of the circuit, among other things.

By using appropriate geometries of components, the switching element 100 then attains the closed, conductive state of FIG. 1D in which the nanotube channel 115 mechanically contacts the control electrode 111 and also output electrode 113c,d. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 1C. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 1A) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 1A. Instead, the electrodes 111 and 112 are expected to be operated so that the channel element 115 will either be in the state of FIG. 1C or 1D.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113b,d (and also 113a,c) of equal potential. Consequently, there are equal but opposing electrostatic forces that result from the voltage on the output node. Because of the equal and opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

Under certain embodiments of the invention, the nanotube switching element 100 of FIG. 1A may be used as pull-up and pull-down devices to form power-efficient circuits. Unlike MOS and other forms of circuits, the pull-up and pull down devices may be identical devices and need not have different sizes or materials. To facilitate the description of such circuits and to avoid the complexity of the layout and physical diagrams of FIGS. 1A-D, a schematic representation has been developed to depict the switching elements.

FIG. 2A is a schematic representation of a nanotube switching element 100 of FIG. 1A. The nodes use the same reference numerals. FIG. 2A illustrates a non-volatile device in which the restoring mechanical force caused by nanotube elongation is insufficient to overcome van der Waals forces such that nanotube element 115 remains in a first or second non-volatile state even when voltage is removed. In a first non-volatile state, nanotube switch 100 remains in the CLOSED (ON) state in contact with control electrode 111 (shown in FIG. 1D) and output electrodes 113c and 113d (shown in FIG. 1D) such that output electrode 113 is in contact with nanotube element 115, which in turn is in contact with signal electrode 114. In a second non-volatile state, nanotube element 115 remains in the OPEN (OFF) state in contact with release electrode 112 such that nanotube element 115 is not in contact with output electrode 113 as illustrated in FIG. 1C when voltage is removed. FIG. 2A' is a schematic representation of a nanotube switching element 100 of FIG. 1A. The nodes use the same reference numbers plus a prime (') to distinguish FIG. 2A' with respect to FIG. 2A. FIG. 2A' illustrates a volatile device in which the restoring mechanical force caused by nanotube elongation is sufficient to disconnect nanotube element 115' from physical contact with control electrode 111' and physical and electrical contact with output electrode 113' thus breaking the contact between signal electrode 114' and output electrode 113'. The arrow 202 is used to show the direction of the mechanical restoring force of the nanotube channel element 115'. For example, as depicted, the channel element has a force away from control electrode 111', i.e., if the channel element 115' were deflected into contact with electrode 111' a mechanical restoring force would be in the direction of arrow 202. An arrow indicating the direction of the mechanical restoring force is only used for devices designed to operate in the volatile mode.

FIGS. 2B-C depict a nanotube channel element 100 when used in a pull-up arrangement and its states of operation. For example, FIG. 2B is a schematic representation of the nanotube switching element in the OPEN (OFF) state illustrated in FIG. 1C, in which node 114 and the nanotube channel element 115 are at $V_{DD}$, the control electrode 111 is at a positive voltage, typically $V_{DD}$, and the release electrode 112 is at zero volts. The nanotube channel element is not in electrical contact with output node 113. FIG. 2C is a schematic representation of the nanotube switching element in the CLOSED (ON) state illustrated in FIG. 1D. In this case, signal node 114 and the nanotube channel element 115 are at $V_{DD}$, the control electrode 111 is at zero volts, and the release electrode 112 is at a positive voltage, typically $V_{DD}$. The nanotube channel element is deflected into mechanical and electrical contact with the output node 113. Moreover, if as described above, geometries are selected appropriately, the contact will be non-volatile as a result of the Van der Waals forces between the channel element and the control electrode. The state of electrical contact is depicted by the short black line 204 representing the nanotube channel element contacting the output terminal 113. This results in the output node 113 assuming the same signal (i.e., Vdd) as the nanotube channel element 115 and signal node 114.

FIGS. 3A-C are analogous to those of FIGS. 2A-C, except they're used to depict a nanotube switching element 100 and its states when used as a pull-down device.

In FIGS. 2 and 3, the nanotube switching element is always operated in a way (at least when power is applied) where the control electrode 111 and the release electrode 112 are always of opposite voltage values. If, for example, control 111 is at zero volts, then release 112 is at a positive voltage, typically $V_{DD}$. If, however, control electrode 111 is at a positive voltage, typically $V_{DD}$, then release electrode 112 is at zero volts. If a positive voltage is associated with a logic "1" state, and a zero voltage is associated with a logic "0" state, then logic states applied to input and release are true and complement, respectively (or complement and true, respectively).

In this regard, the nanotube switching element 100 is operated as a dual-rail differential logic element. Dual-rail differential logic design (or simply differential logic design) techniques applied to the non-volatile 4-terminal nanotube switching devices 100 of FIG. 1 may be used to result in a non-volatile dual-rail differential logic family by using such devices 100 to form fundamental building blocks for a logic family, e.g., NOT and NOR circuits. This non-volatile logic family will perform logic operations when activated, and preserve the logic state in a non-volatile mode when power is removed (or interrupted). This logic family may resume logic operation when power is restored, with each logic circuit in the same state as prior to power removal (or interruption). Circuit examples follow.

Figure 4:
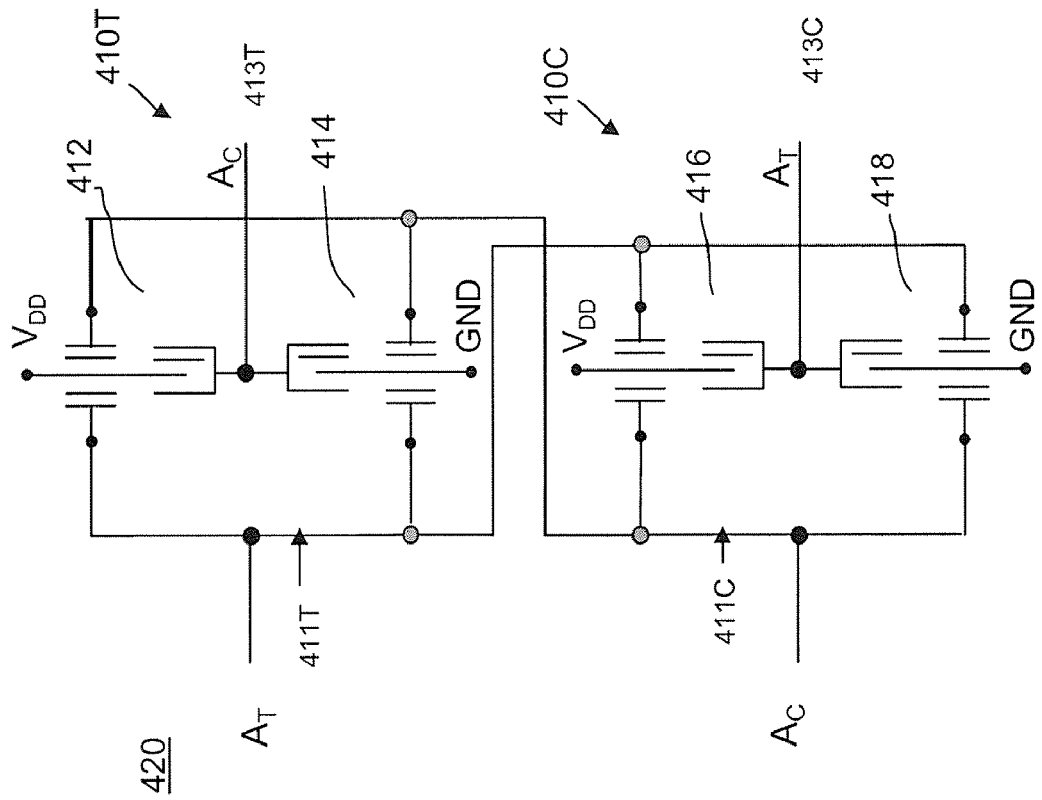
FIG. 4 shows a schematic representation of an exemplary dual-rail input, dual-rail output inverter circuit constructed from nanotube switching elements.

FIG. 4 illustrates a dual rail inverter 420 according to certain embodiments of the invention. The inverter circuit 420 includes an upper portion 410T and a lower portion 410C.

The upper portion 410T includes a nanotube switching element 412 arranged as a pull-up device with the signal node connected to Vdd, and a nanotube switching element 414 arranged as a pull-down device with the signal node connected to ground. Both switching elements receive a true version $A_T$ of logic signal A on their respective control nodes (111 of FIG. 1A) via input link 411T, and both have their output nodes (113 of FIG. 1A) connected together to output node 413T, which provides a complement version $A_C$ of logic signal A.

The lower portion 410C includes a nanotube switching element 416 arranged as a pull-up device with the signal node connected to Vdd, and a nanotube switching element 418 arranged as a pull-down device with the signal node connected to ground. Both switching elements receive a complement version $A_C$ of logic signal A on their respective control nodes (111 of FIG. 1A) via input link 411C, and both have their output nodes (113 of FIG. 1A) connected together to output node 413C, which provides true version $A_T$ of logic signal A.

The input 411T of upper portion 410T is coupled to the release nodes of both switching elements of the lower portion 410C. Likewise, the input 411C of lower portion 410C is coupled to the release nodes of both switching elements of the upper portion 410T.

Thus, inverter circuit 420 receives dual rail, differential inputs $A_T$ and $A_C$ of logic signal A, and provides corresponding inversions of the inputs on links 411 and 413, respectively, when operated as described above. Moreover, the logic is non-volatile, meaning the gate retains its state even if power were interrupted from the circuit. In addition, because the circuit is arranged as a complementary logic circuit with pull-up and pull-down devices, current flows (and power is consumed) only during switching, so there is no DC current between $V_{DD}$ and ground.

Figure 5:
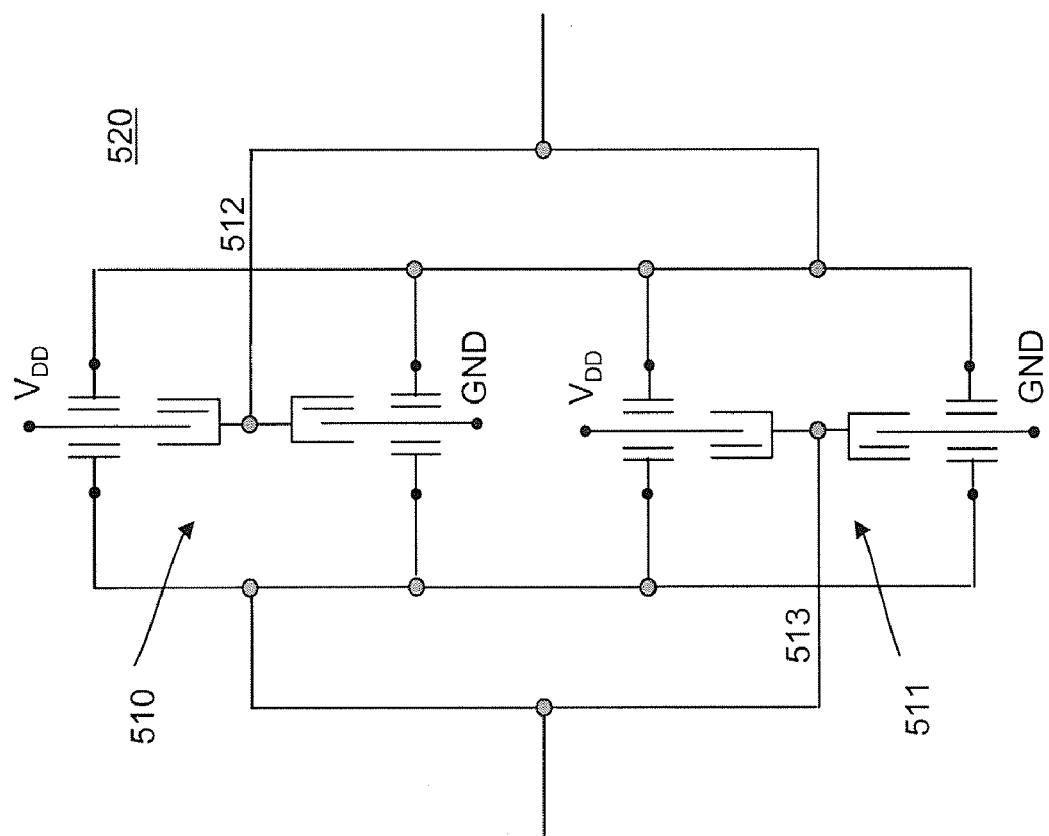
FIG. 5 shows a schematic representation of an exemplary dual-rail flip-flop circuit constructed from nanotube switching elements.
Figure 6A:
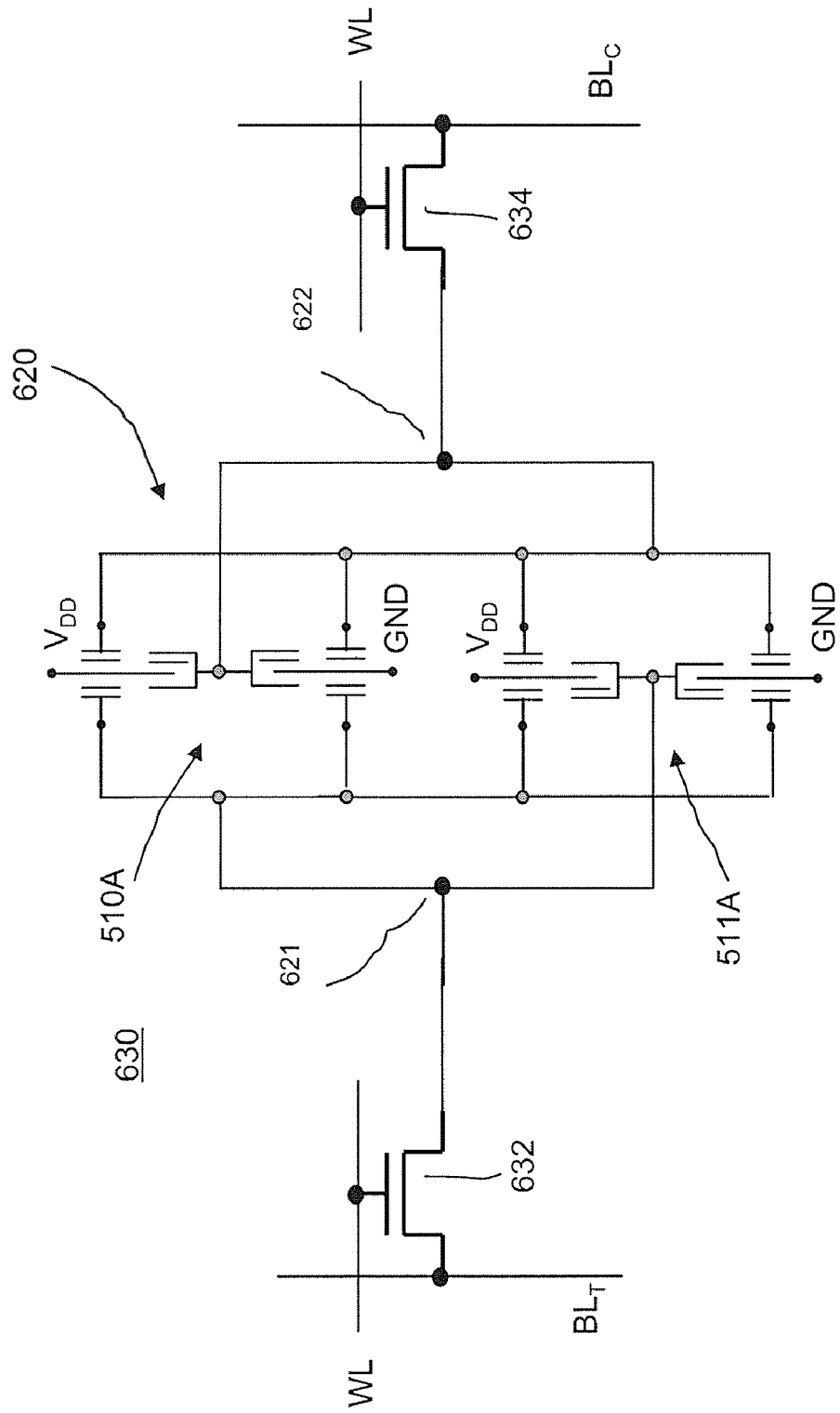
FIGS. 6A-6B show a schematic representation of the use of an exemplary nanotube static ram cell and a dual-rail flip-flop circuit to construct a non-volatile ram cell.
Figure 6B:
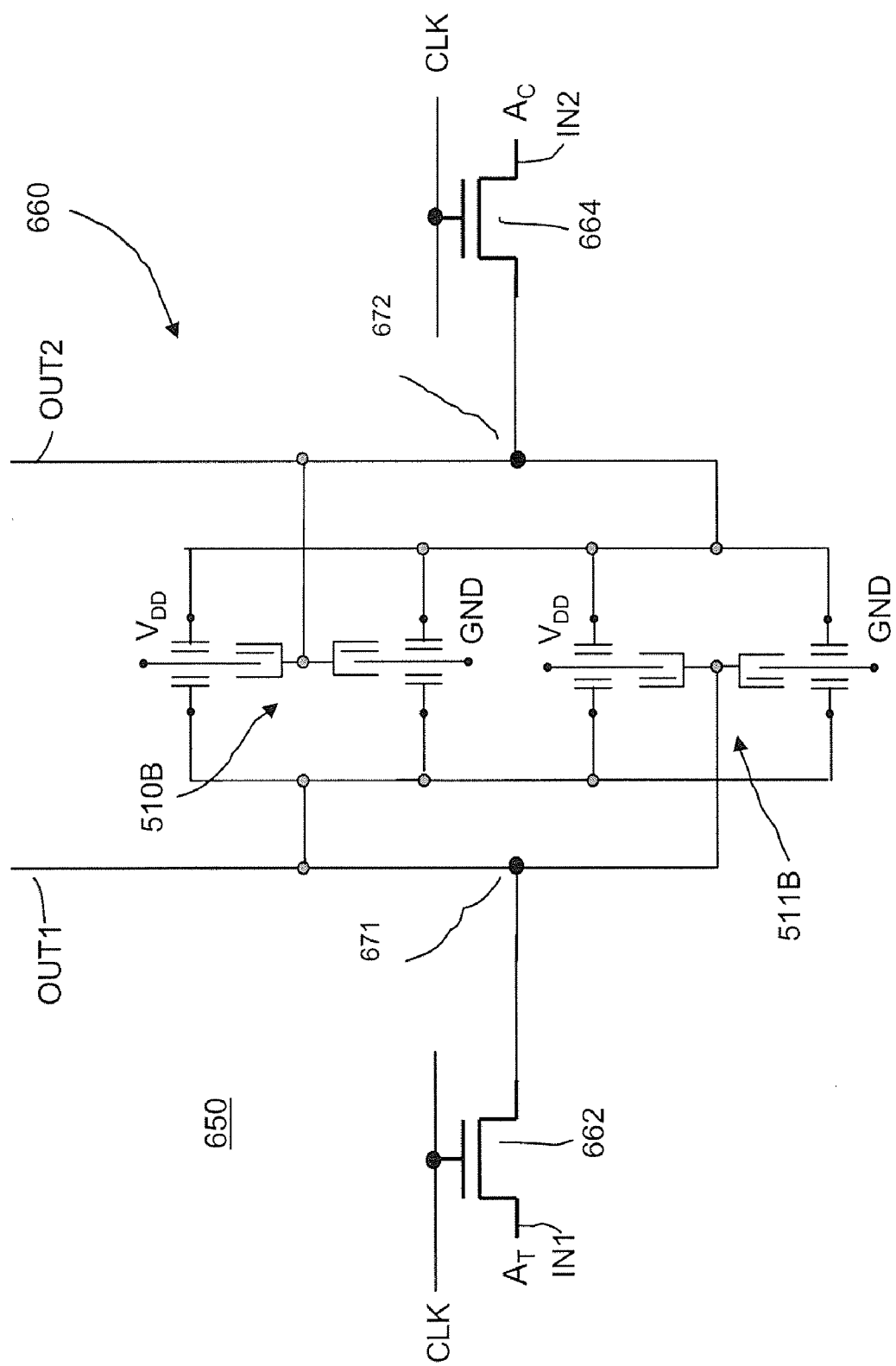

FIG. 5, using the same schematic notation as above, depicts a non-volatile state device 520 of certain embodiments. The latch 520 is formed by cross-connecting inverters 510 and 511. Output node 512 of inverter 510 is connected to the control electrode inputs of inverter 511 and the release electrode inputs of inverter 510. Output node 513 is connected to the control electrode inputs of inverter 510 and the release electrode inputs of inverter 511. State device 520 is a non-volatile storage element; that is, state device 520 will retain its logic state if power is removed and assume the same state when power is restored. State device 520 can be combined with logic gates (not shown) to generate a non-volatile NRAM storage cell as illustrated in FIG. 6A, and various types of flip flops and latches used in logic design such as a S-R, J-K, and other flip flop structures. FIG. 6B illustrates state devices 520 used in a latch configuration. Current flows only during switching, so there is no DC current between $V_{DD}$ and ground.

FIG. 6A illustrates a state device 620 used as a non-volatile nanotube static RAM cell (NRAM cell) 630 according to another embodiment of the invention. In this embodiment, the control electrodes of the upper inverter 510A, and the release electrodes of the lower inverter 511A, are connected to a logical bit line ($BL_T$) input signal via select transistor 632 gated via signal WL and connected to state device 620 at node 621. The control electrodes of the lower inverter, and the release electrodes of the upper inverter, are connected to a complementary version ($BL_C$) of logical bit line (BL) input signal via select transistor 634 gated via signal WL and connected to state device 620 node 622. In this fashion, a state device may be formed into a non-volatile NRAM storage cell 630. Inverters 510A and 511A are designed to be identical in electrical characteristics so that the NRAM cell is balanced (does not favor one state over the other). Select devices 632 and 634 are designed to be sufficiently large so as to supply sufficient drive current to overcome the stored state of state device 620, as is well known in the art of static RAM cell design.

NRAM cell 630 has the advantage of non-volatile storage. Also, the nanotube latch portion 620 may be formed using separate layers. Select transistors 632 and 634 are the only semiconductors required in the cell region. The NRAM cell may be smaller than an SRAM cell because there is no need for a transistor latch. Eliminating the transistor flip-flop also eliminates the need for both PMOS and NMOS transistors in cell, and both P-Well and N-Well regions to accommodate the respective NMOS and PMOS transistor source and drain diffusions. A non-volatile NRAM cell 630 may be smaller than a volatile (transistor-based) SRAM cell because only NMOS select transistors 32 and 34 and contacts to nanotube based latch 620 layers are required. Current flows only during switching (cell write), or cell readout, so there is no DC current between $V_{DD}$ and ground. NRAM cell 630 is non-volatile; that is, the memory state is preserved if power is turned-off (or disturbed) and resumes operation in the same memory state as the memory state just prior to power turn-off (or interruption).

FIG. 6B depicts a state device 660 used as a non-volatile nanotube latch 650 according to another embodiment of the invention. In this embodiment, the control electrodes of the upper inverter 510B, and the release electrodes of the lower inverter 511B, are connected to a logical input signal $A_T$ (applied to IN1) via select transistor 662 gated via clock signal CLK and connected to state device 660 at node 671. The control electrodes of the lower inverter, and the release electrodes of the upper inverter, are connected to a complementary version input signal $A_C$ (applied to IN2) via select transistor 664 gated via clock signal CLK and connected to state device 660 node 672. In this fashion, a state device may be formed into a nanotube latch 650. Inverter 511B is designed to be the dominant inverter (composed of nanotube devices containing more nanotubes), and 510B is designed to be a feedback inverter (composed of nanotube devices containing less nanotubes) that supplies the charge necessary to compensate for discharge of a state device node in case of noise, for example, as described in the reference book H. B. Bakoglu, "Circuits, Interconnections, and Packaging for VLSI", Addison-Wesley Publishing Company, pages 349-351. Inverters 511B, 510B, and pass transistors 662 and 664 are ratioed to make sure that latch 660 will switch to the desired state when data is being written to it. Feedback inverter 510B has to be sufficiently weak so that circuits (not shown) that drive state device 660 through clocked devices 662 and 664 can overpower feedback inverter 510B and overcome the latch 650 state stored in state device 660 in the Bakoglu reference. Complementary logic latch outputs are labeled OUT1 and OUT2. Latch 650 is non-volatile; that is, the logic state is preserved if power is turned-off (or disturbed) and resumes operation in the same logic state as the logic state just prior to power turn-off (or interruption).

Figure 7:
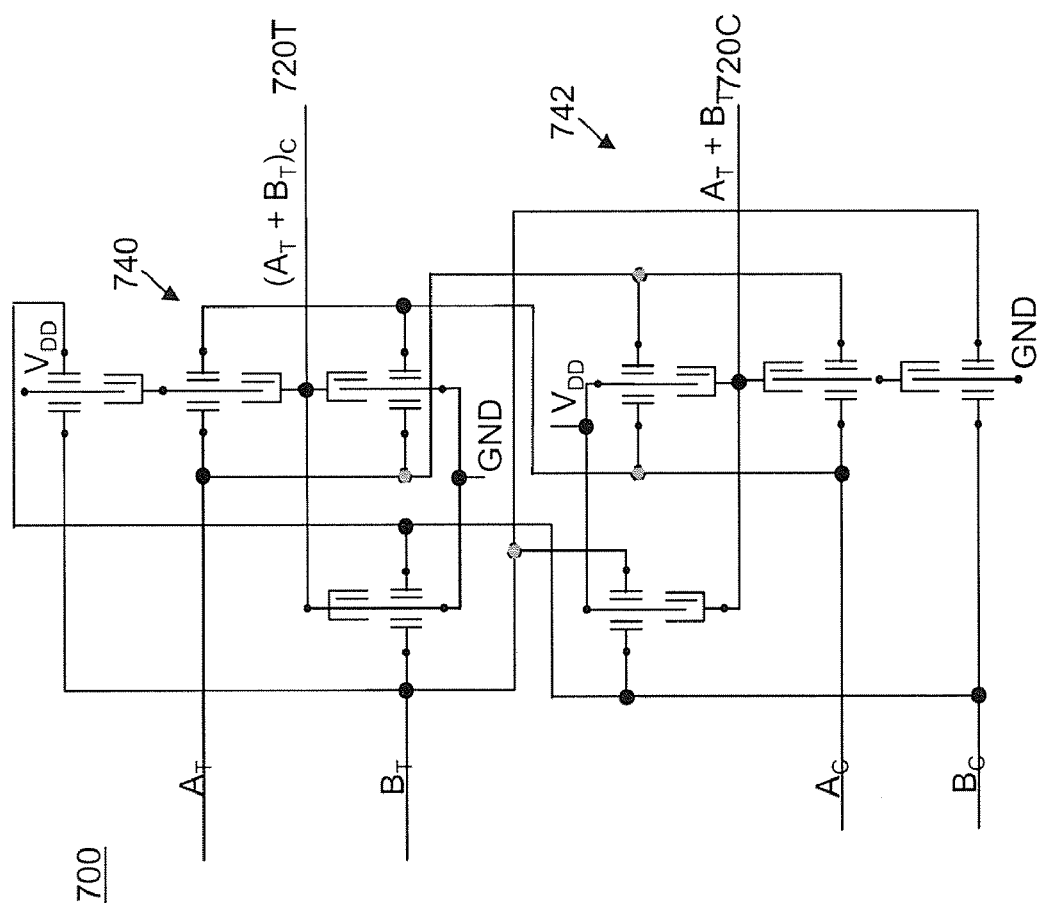
FIG. 7 shows a schematic representation a dual rail nanotube-based NOR circuit.

FIG. 7 depicts a non-volatile, nanotube-based Cascode Voltage Switch Logic (CVSL) circuit 700 according to certain embodiments. Circuit 700 is composed of two complementary logic portions 740 and 742. The output of logic circuit 700 is required to generate both true 720T and complement 720C logic outputs. Logic circuit 700 is non-volatile; that is, the logic state is preserved if power is turned-off (or disturbed) and resumes operation in the same logic state as the logic state just prior to power turn-off (or interruption). Logic circuit 740 is a non-volatile nanotube-based NOR circuit, whose inputs are activated by A and B in true and complement form, and whose corresponding output is $(A_T+B_T)_C$ as illustrated in FIG. 7. Logic circuit 742 is a non-volatile NAND circuit, whose output is $A_T+B_T$, when activated by inputs $A_C$ and $B_C$, and release A and B, as illustrated in FIG. 7. Current flows only during switching, and there is no DC current between $V_{DD}$ and GND.

Figure 8B:
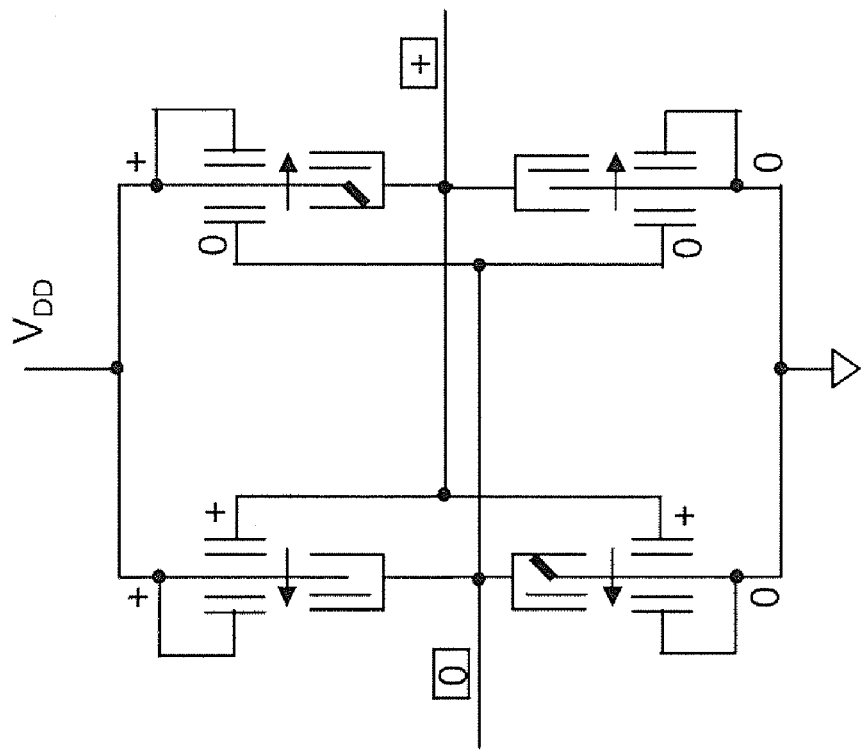
FIGS. 8A-8B shows an exemplary schematic representation of a volatile 4-terminal nanotube switching device operated as a 3-terminal device in a latch circuit.
Figure 8A:
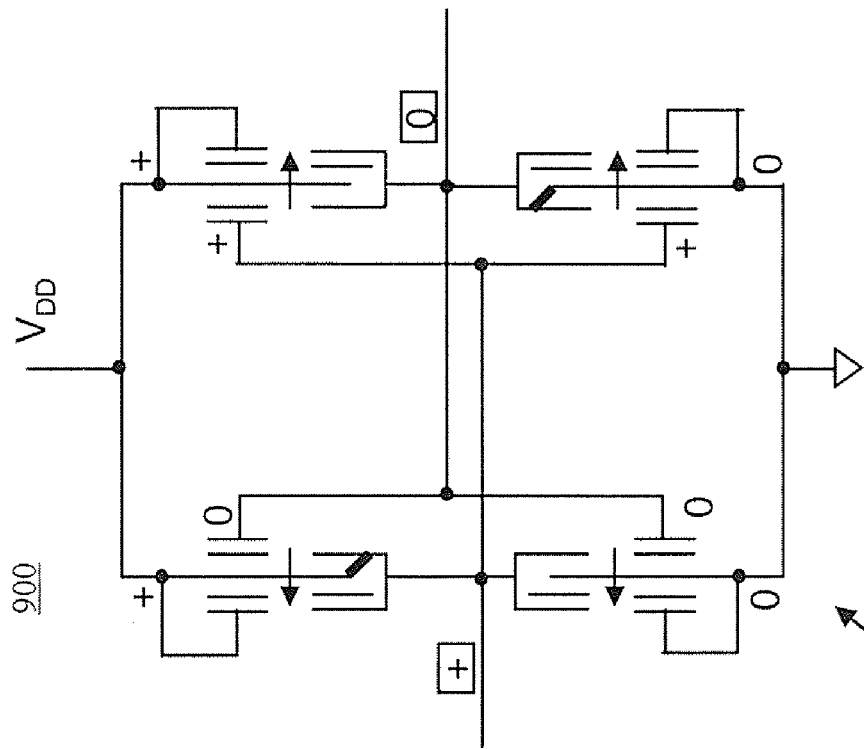

As discussed, the 4-terminal devices of FIG. 1 may also be constructed with a nanotube length to gap size ratio of less than 5 to create a volatile device. This 4-terminal volatile device may also be operated as dual-rail, differential logic but will not preserve the logic state when the power to the circuit is interrupted. A schematic representation of a volatile 4-terminal device is shown in FIG. 2A'. A 4-terminal volatile device may be operated as a 3-terminal volatile device if the release electrode is connected to the nanotube channel element through a low resistance electrical path such as a metallization layer. Referring to FIG. 2A', for example, release terminal 112' is electrically connected to nanotube signal electrode 114'. This allows single-rail volatile logic, dual-rail volatile logic, and dual-rail non-volatile logic to be mixed on a single substrate using nanotube switching devices designed for non-volatile operation, and nanotube switching devices designed for volatile operation. FIGS. 8A-8B show examples of a 4-terminal device used as a 3-terminal device in a four device volatile state device configuration.

Nanotube-based logic may be used in conjunction with and in the absence of diodes, resistors and transistors or as part of or a replacement to CMOS, biCMOS, bipolar and other transistor level technologies. Also, the non-volatile flip flop may be substituted for an SRAM flip flop to create a NRAM cell. The interconnect wiring used to interconnect the nanotube device terminals may be conventional wiring such as AlCu, W, or Cu wiring with appropriate insulating layers such as SiO2, polyimide, etc, or may be single or multi-wall nanotubes used for wiring.

The inventors envision additional configurations of volatile and nonvolatile or mixed nanoelectromechanical designs depending upon the specific application, speed, power requirements and density desired. Additionally the inventors foresee the use of multiwalled carbon nanotubes or nanowires as the switching element of contact points within the switch. As the technology node decreases in size from 90 nm to 65 nm and below down to the size of individual nanotubes or nanowires the inventors foresee adapting the basic electromechanical switching elements and their operation to a generation of nanoscale devices with scaleable performance characteristics concomitant with such size reduction.

The nanotube switching element of preferred embodiments utilizes multiple controls for the formation and unformation of the channel. In some embodiments, the device is sized to create a non-volatile device and one of the electrodes may be used to form a channel and the other may be used to unform a channel. The electrodes may be used as differential dual-rail inputs. Alternatively they may be set and used at different times. For example, the control electrode may be used in the form of a clock signal, or the release electrode may be used as a form of clocking signal. Also, the control electrode and release electrode may be placed at the same voltage, for example, such that the state of the nanotube cannot be disturbed by noise sources such as voltage spikes on adjacent wiring nodes.

A FIG. 1 device may be designed to operate as a volatile or non-volatile device. In the case of a volatile device, the mechanical restoring force due to nanotube elongation is stronger than the van der Waals retaining force, and the nanotube mechanical contact with a control or release electrode insulator is broken when the electrical field is removed. Typically, nanotube geometrical factors such as suspended length to gap ratios of less than 5 to 1 are used for volatile devices. In the case of a non-volatile device, the mechanical restoring force due to nanotube elongation is weaker than the van der Waals retaining force, and the nanotube mechanical contact with a control or release electrode insulator remains un-broken when the electric field is removed. Typically, nanotube geometrical factors such as suspended length to gap ratios of greater than 5 to 1 and less than 15 to 1 are used for non-volatile devices. An applied electrical field generating an electromechanical force is required to change the state of the nanotube device. Van der Waals forces between nanotubes and metals and insulators are a function of the material used in the fabrication nanotube switches. By way of example, these include insulators such as silicon dioxide and silicon nitride, metals such as tungsten, aluminum, copper, nickel, palladium, and semiconductors such as silicon. For the same surface area, forces will vary by less than 5% for some combinations of materials, or may exceed 2× for other combinations of materials, so that the volatile and non-volatile operation is determined by geometrical factors such as suspended length and gap dimensions and materials selected. It is, however, possible to design devices by choosing both geometrical size and materials that exhibit stronger or weaker van der Waals forces. By way of example, nanotube suspended length and gap height and fabric layer density, control electrode length, width, and dielectric layer thickness may be varied. Output electrode size and spacing to nanotube may be varied as well. Also, a layer specifically designed to increase van der Waals forces (not shown) may be added during the fabrication nanotube switching element 100 illustrated in FIG. 1. For example, a thin (5 to 10 nm, for example) layer of metal (not electrically connected), semiconductor (not electrically connected), or insulating material may be added (not shown) on the insulator layer associated with control electrode 111 or release electrode 112 that increases the van der Waals retaining force without substantial changes to device structure for better non-volatile operation. In this way, both geometrical sizing and material selection are used to optimize device operation, in this example to optimize non-volatile operation.

In a complementary circuit such as an inverter using two nanotube switching elements 100 with connected output terminals, there can be momentary current flow between power supply and ground in the inverter circuit as the inverter changes from one logic state to another logic state. In CMOS, this occurs when both PFET and NFET are momentarily ON, both conducting during logic state transition and is sometimes referred to as "shoot-through" current. In the case of electromechanical inverters, a momentary current may occur during change of logic state if the nanotube fabric of a first nanotube switch makes conductive contact with the first output structure before the nanotube fabric of a second nanotube switch releases conductive contact with the second output structure. If, however, the first nanotube switch breaks contact between the first nanotube fabric and the first output electrode before the second nanotube switch makes contact between the second nanotube fabric and the second output electrode, then a break-before-make inverter operation occurs and "shoot-through" current is minimized or eliminated. Electromechanical devices that favor break-before-make operation may be designed with different gap heights above and below the nanotube switching element, for example, such that forces exerted on the nanotube switching element by control and release electrodes are different; and/or travel distance for the nanotube switching element are different in one direction than another; and/or materials are selected (and/or added) to increase the van der Waals forces in one switching direction and weakening van der Waals forces in the opposite direction.

By way of example, nanotube switching element 100 illustrated in FIG. 1 may be designed such that gap G102 is substantially smaller (50% smaller, for example) than gap G104. Also, gap G103 is made bigger such that nanotube element 115 contact is delayed when switching. Also, dielectric thicknesses and dielectric constants may be different such that for the same applied voltage differences, the electric field between release electrode 112 and nanotube element 115 is stronger than the electric field between control electrode 111 and nanotube element 115, for example, to more quickly disconnect nanotube element 115 from output terminals 113c and 113d. Output electrodes 113c and 113d may be designed to have a small radius and therefore a smaller contact area in a region of contact with nanotube element 115 compared with the size (area) of contact between nanotube element 115 and the insulator on control terminal 111 to facilitate release of contact between nanotube element 115 and output electrodes 113c and 113d. The material used for electrodes 113c and 113d may be selected to have weaker van der Waals forces respect to nanotube element 115 than the van der Waals forces between nanotube element 115 and the insulator on release electrode 112, for example. These, and other approaches, may be used to design a nanotube switching element that favors make-before-break operation thus minimizing or eliminating "shoot-through" current as circuits such as inverters switch from one logic state to another.

The material used in the fabrication of the electrodes and contacts used in the nanotube switches is dependent upon the specific application, i.e. there is no specific metal necessary for the operation of the present invention.

Nanotubes can be functionalized with planar conjugated hydrocarbons such as pyrenes which may then aid in enhancing the internal adhesion between nanotubes within the ribbons. The surface of the nanotubes can be derivatized to create a more hydrophobic or hydrophilic environment to promote better adhesion of the nanotube fabric to the underlying electrode surface. Specifically, functionalization of a wafer/substrate surface involves "derivitizing" the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface may be derivitized prior to application of a nanotube fabric.

While single walled carbon nanotubes are preferred, multi-walled carbon nanotubes may be used. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc. The invention relates to the generation of nanoscopic conductive elements used for any electronic application.

The following patent references refer to various techniques for creating nanotube fabric articles and switches and are assigned to the assignee of this application. Each is hereby incorporated by reference in their entirety:

U.S. patent application Ser. No. 10/341,005, filed on Jan. 13, 2003, entitled Methods of Making Carbon Nanotube Films, Layers, Fabrics, Ribbons, Elements and Articles;

U.S. patent application Ser. No. 09/915,093 (now U.S. Pat. No. 6,919,592), filed on Jul. 25, 2001, entitled Electromechanical Memory Array Using Nanotube Ribbons and Method for Making Same;

U.S. patent application Ser. No. 10/033,032 (now U.S. Pat. No. 6,784,028), filed on Dec. 28, 2001, entitled Methods of Making Electromechanical Three-Trace Junction Devices;

U.S. patent application Ser. No. 10/033,323 (now U.S. Pat. No. 6,911,682), filed on Dec. 28, 2001, entitled Electromechanical Three-Trace Junction Devices;

U.S. patent application Ser. No. 10/128,117 (now U.S. Pat. No. 6,835,591), filed on Apr. 23, 2002, entitled Methods of NT Films and Articles;

U.S. patent application Ser. No. 10/341,055, filed Jan. 13, 2003, entitled Methods of Using Thin Metal Layers to Make Carbon Nanotube Films, Layers, Fabrics, Ribbons, Elements and Articles;

U.S. patent application Ser. No. 10/341,054, filed Jan. 13, 2003, entitled Methods of Using Pre-formed Nanotubes to Make Carbon Nanotube Films, Layers, Fabrics, Ribbons, Elements and Articles;

U.S. patent application Ser. No. 10/341,130, filed Jan. 13, 2003, entitled Carbon Nanotube Films, Layers, Fabrics, Ribbons, Elements and Articles;

U.S. patent application Ser. No. 10/776,059, filed Feb. 11, 2004, entitled Devices Having Horizontally-Disposed Nanofabric Articles and Methods of Making The Same; and U.S. patent application Ser. No. 10/776,572 (now U.S. Pat. No. 6,924,538), filed Feb. 11, 2004, entitled Devices Having Vertically-Disposed Nanofabric Articles and Methods of Making the Same.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A switching element comprising:
an input node;
an output node;
a nanotube channel element having at least one electrically conductive nanotube;
a control structure disposed in relation to the nanotube channel element to controllably form and unform an electrically conductive channel between said input node and said output node, the electrically conductive channel comprising said nanotube channel element;
wherein said output node is constructed and arranged so that the channel formation is substantially unaffected by the electrical state of the output node; and wherein the electrically conductive channel is volatilely formed.

2. The switching element of claim 1 wherein the control structure includes:

a control electrode;

a release electrode;

wherein the control electrode and release electrode are disposed on opposite sides of and in spaced relation to the nanotube channel element; and wherein in response to electrical stimulus at the control electrode and release electrode, the control structure controllably forms and unforms said conductive channel by inducing electromechanical deflection of said nanotube channel element.

3. The switching element of claim 2 wherein the release electrode is electrically coupled to the nanotube channel element.

4. The switching element of claim 3 wherein the nanotube channel element is positionable to at least two positional states in response to a relationship of signals on the nanotube channel element and the control electrode; and wherein in the absence of signals on the nanotube channel element and the control electrode, the nanotube channel element is positionable to at least one positional state in response to a mechanical restoring force resulting from the physical characteristics of the nanotube channel element.

5. The switching element of claim 2 wherein the release electrode is electrically coupled to a reference voltage.

6. The switching element of claim 2 wherein the release electrode is electrically coupled to a ground voltage.

7. The switching element of claim 2 wherein said nanotube channel element is in electrical communication with the input node.

8. The switching element of claim 7 wherein the nanotube channel element is positionable to at least two positional states in response to a relationship of signals on the nanotube channel element, the control electrode and the release electrode; and wherein in the absence of signals on the nanotube channel element, the control electrode and the release electrode, the nanotube channel element is positionable to at least one positional state in response to a mechanical restoring force resulting from the physical characteristics of said nanotube channel element.

9. The switching element of claim 8 wherein when the electrical stimulus applied to the control electrode is of an approximately equivalent voltage as the electrical stimulus applied to the release electrode, the positional state of the nanotube channel element is substantially unaffected by electrical noise at the input terminal and the output terminal of the nanotube switching element.

10. The switching element of claim 8 wherein forming the conductive channel comprises positioning the nanotube channel element into a first of said at least two positional states wherein the nanotube channel element is in electrical contact with the output node.

11. The switching element of claim 10 wherein unforming the conductive channel includes positioning the nanotube channel element into a second of said at least two positional states wherein the nanotube channel element is physically distant from the output node.

12. The switching element of claim 8 wherein unforming the conductive channel includes positioning the nanotube channel element into said at least one positional state in response to said mechanical restoring force wherein the nanotube channel element is physically distant from the output node.

13. The switching element of claim 2 wherein said output node includes an isolation structure disposed in relation to the nanotube channel element so that the channel formation is substantially invariant from the state of the output node.

14. The switching element of claim 13 wherein the isolation structure comprises:

an insulator disposed on the control electrode;

a first spaced relation between the surface of said insulator and the nanotube channel element in at least one positional state;

a second spaced relation between the release electrode and the nanotube channel element in said at least one positional state; and two sets of electrodes disposed on opposite sides of the control structure, each set of electrodes including electrodes disposed on opposite sides of the nanotube channel element.

15. The switching element of claim 14 wherein said first spaced relation, said second spaced relation have different magnitudes.

16. The switching element of claim 14 wherein the length of the nanotube channel element is less than approximately five times the size of said first spaced relation.

17. The switching element of claim 14 constructed and arranged so that a mechanical restoring force of the nanotube channel element exceeds the Van der Waals attraction force between the nanotube channel element and the adjacent surface of the control structure.

18. The switching element of claim 13 wherein the isolation structure comprises an insulator disposed on the release electrode.

* * * * *